(12) United States Patent
Chen et al.

(10) Patent No.: US 11,587,808 B2
(45) Date of Patent: Feb. 21, 2023

(54) CHIP CARRIER DEVICE

(71) Applicant: Powertech Technology Inc., Hsinchu (TW)

(72) Inventors: Shih-Chun Chen, Hukou (TW); Sheng-Tou Tseng, Hukou (TW); Kun-Chi Hsu, Hukou (TW); Chin-Ta Wu, Hukou (TW); Ying-Lin Chen, Hukou (TW); Ting-Yeh Wu, Hukou (TW)

(73) Assignee: Powertech Technology Inc., Hsinchu (TW)

( * ) Notice: Subject to any disclaimer, the term of this patent is extended or adjusted under 35 U.S.C. 154(b) by 415 days.

(21) Appl. No.: 16/998,266

(22) Filed: Aug. 20, 2020

(65) Prior Publication Data

US 2021/0217641 A1 Jul. 15, 2021

(30) Foreign Application Priority Data

Jan. 10, 2020 (TW) .................................. 109100964

(51) Int. Cl.
*H01L 21/673* (2006.01)
*C23C 14/56* (2006.01)

(52) U.S. Cl.
CPC ........ *H01L 21/67326* (2013.01); *C23C 14/56* (2013.01); *H01L 21/67346* (2013.01)

(58) Field of Classification Search
CPC .................. B25B 11/00; B23Q 3/00; H01L 21/673–67396
USPC ........ 451/283–288, 41, 364; 269/903, 289 R
See application file for complete search history.

(56) References Cited

U.S. PATENT DOCUMENTS

| | | | |
|---|---|---|---|
| 5,571,594 A * | 11/1996 | Minowa | B05C 13/02 428/167 |
| 8,430,264 B2 * | 4/2013 | Jewram | H05K 13/0084 206/725 |
| 10,192,785 B2 * | 1/2019 | Liu | H01L 23/552 |
| 11,183,413 B2 * | 11/2021 | Baek | H01L 21/67333 |
| 2017/0117184 A1 | 4/2017 | Liu et al. | |

* cited by examiner

*Primary Examiner* — Lee D Wilson
*Assistant Examiner* — Robert F Neibaur
(74) *Attorney, Agent, or Firm* — Burris Law, PLLC

(57) ABSTRACT

A chip carrier device includes a frame, a chip support and a limiter. The chip support is disposed on the frame, and includes a supporting film for chips to be adhered thereto. A peripheral portion of the supporting film is attached to a surrounding frame part of the frame. A crossing portion of the supporting film passes through a center of the supporting film, and interconnects two opposite points of the peripheral portion. The supporting film is formed with through holes. The limiter includes a limiting part that interconnects two opposite points of the surrounding frame part, that is positioned corresponding to the crossing portion, and that is positioned on one side of the supporting film where the chips are to be arranged.

6 Claims, 3 Drawing Sheets

CHIP CARRIER DEVICE

CROSS-REFERENCE TO RELATED APPLICATION

This application claims priority of Taiwanese Invention Patent Application No. 109100964, filed on Jan. 10, 2020.

FIELD

The disclosure relates to a chip carrier device, and more particularly to a chip carrier device adapted to hold chips in a chamber for sputter deposition.

BACKGROUND

To ensure thickness uniformity of thin films coated on chips in a chamber for sputter deposition, air cooling is often performed to maintain temperature uniformity among the chips. However, referring to FIG. 1, for a conventional chip carrier device that includes an adhesive film 201 where chips 202 are adhered thereto, cooling air 101 blown toward the adhesive film 201 may cause deformation of the adhesive film 201 because the adhesive film 201 is soft and is supported merely by a surrounding frame 203 at a peripheral portion of the adhesive film 201, which is disposed on a platform 100. The deformation of the adhesive film 201 would move the chips 202 adhered thereto from their original positions with respect to the platform 100, disrupting temperature uniformity among the chips 202 and as a result, thickness uniformity of thin films coated on the chips 202 may not be ensured.

U.S. Patent Application Publication No. 20170117184 discloses a double-sided adhesive film that is utilized to hold chips on one side and have a supporting plate adhered to the opposite side. The supporting plate is perforated, and has a shape corresponding to that of the double-sided adhesive film to provide full support. In this way, the aforementioned issue of deformation of the adhesive film may be alleviated. However, utilization of the double-sided adhesive film may increase manufacturing cost, and the chamber for sputter deposition may be contaminated by chemical substances coming from the dual-sided adhesive film during sputter deposition.

SUMMARY

Therefore, an object of the disclosure is to provide a chip carrier device as an alternative solution.

According to the disclosure, the chip carrier device is adapted to hold a plurality of chips in a chamber for sputter deposition. The chip carrier device includes a frame, a chip support and a limiter.

The frame includes a surrounding frame part.

The chip support is disposed on the frame, and includes a supporting film. The supporting film is adapted for the chips to be arranged on and adhered to one side of the supporting film. The supporting film includes a peripheral portion and at least one crossing portion. The peripheral portion corresponds in shape to the surrounding frame part, and is attached to the surrounding frame part. The at least one crossing portion passes through a center of the supporting film, and interconnects two opposite points of the peripheral portion. The supporting film is formed with a plurality of through holes which are in groups with each of the groups being encircled by the peripheral portion and the at least one crossing portion. The through holes are each adapted for placement of a respective one of the chips such that a portion of the respective one of the chips is exposed there through. The through holes are spaced apart from each other and arranged in arrays, such that the chips are spaced apart from each other and arranged in positions respectively corresponding to the through holes.

The limiter includes at least one limiting part that interconnects two opposite points of the surrounding frame part, that is positioned corresponding to the at least one crossing portion, and that is positioned on the one side of the supporting film where the chips are to be adhered to.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
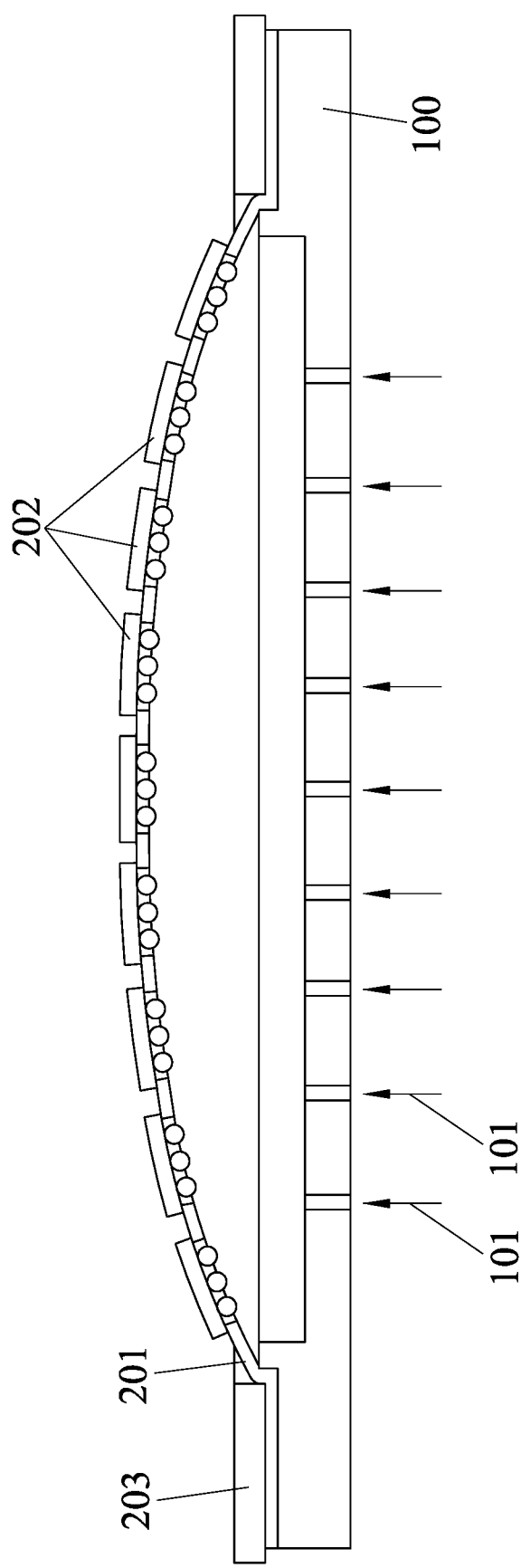
FIG. 1 is a schematic diagram illustrating a cross-section of a conventional chip carrier device.
Figure 2:
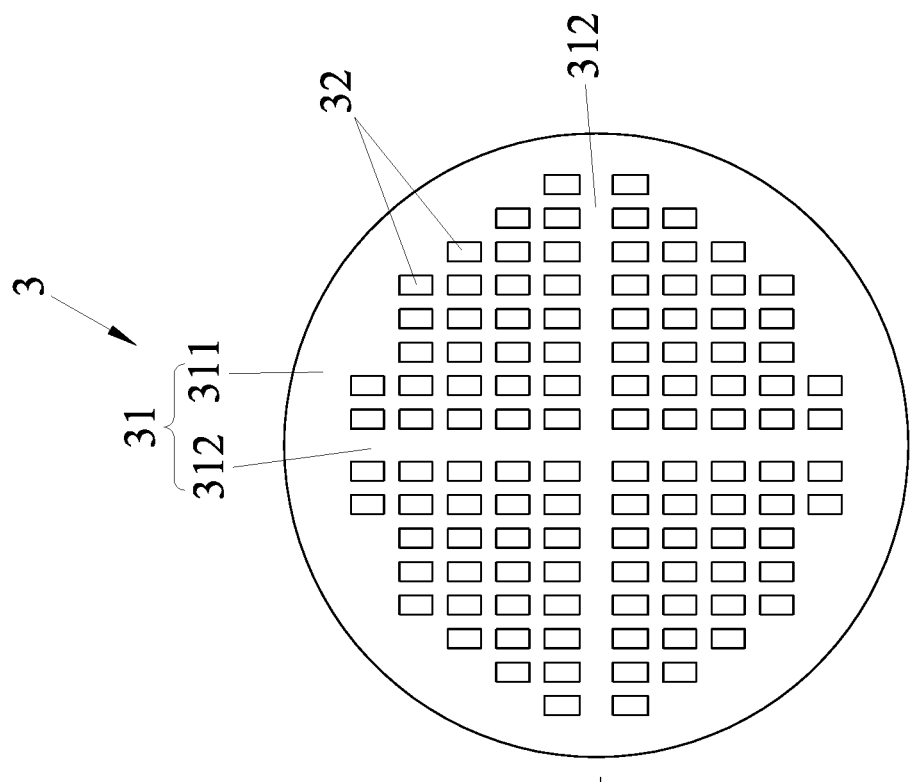
FIG. 2 is a top-view schematic diagram illustrating separated components of an embodiment of a chip carrier device according to the disclosure.
Figure 2:
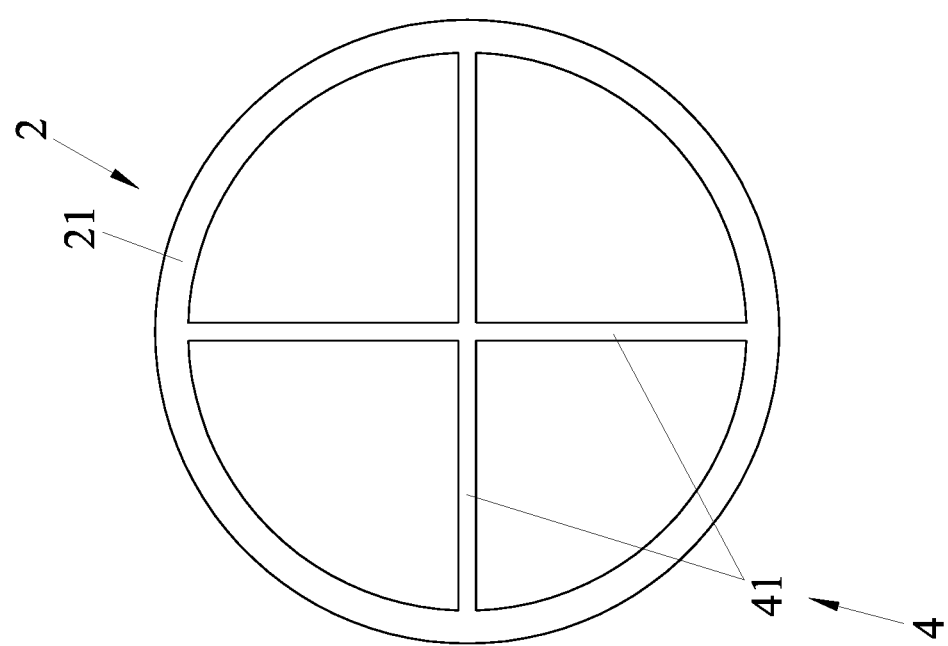
Figure 3:
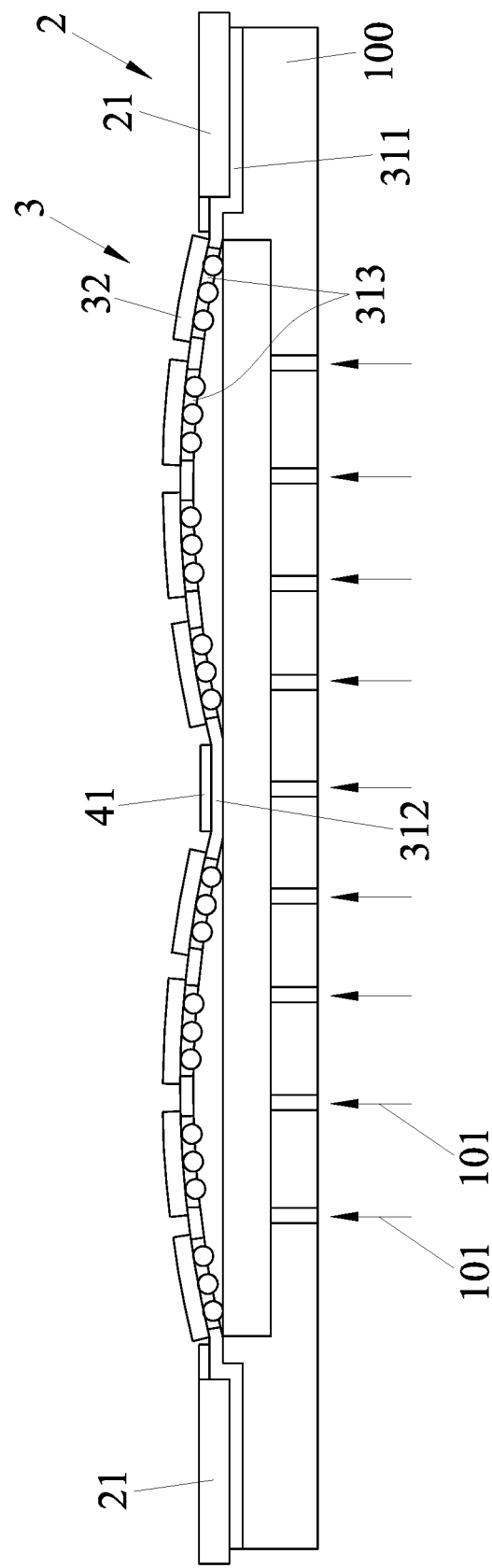
FIG. 3 is a schematic diagram illustrating a cross-section of the embodiment of the chip carrier device according to the disclosure.

Referring to FIGS. 2 and 3, an embodiment of a chip carrier device according to the disclosure is illustrated. The chip carrier device is adapted to hold a plurality of chips 32 in a chamber for sputter deposition.

The chip carrier device includes a frame 2, a chip support 3 and a limiter 4.

The frame 2 includes a surrounding frame part 21. In this embodiment, the surrounding frame part 21 is a circular ring, but the shape of the surrounding frame part 21 is not limited thereto. The surrounding frame part 21 may be made of heat-resistant material such as iron or stainless steel.

The chip support 3 is disposed on the frame 2, and includes a supporting film 31 that is adapted for the chips 32 to be arranged on and adhered to one side of the supporting film 31.

The supporting film 31 is a single-sided adhesive film, and may be implemented by a polyimide (PI) film, or a blue tape, which is also known as a polyvinyl chloride (PVC) film and is widely used in semiconductor fabrication.

The supporting film 31 includes a peripheral portion 311 and two crossing portions 312. It should be noted that the number of the crossing portions 312 is not limited to the disclosure herein and may vary in other embodiments.

The peripheral portion 311 of the supporting film 31 corresponds in shape to the surrounding frame part 21 of the frame 2, and the supporting film 31 has a diameter substantially equal to an outer diameter of the surrounding frame part 21. The peripheral portion 311 of the supporting film 31 is attached to the surrounding frame part 21 of the frame 2.

The crossing portions 312 intersect each other. Each of the crossing portions 312 passes through a center of the supporting film 31, and interconnects two opposite points of the peripheral portion 311.

The supporting film 31 is formed with a plurality of through holes 313 for placement of the chips 32. The through holes 313 are in groups and each group is encircled by the peripheral portion 311 and the crossing portions 312. In other words, the through holes 313 are distributed in areas defined by the peripheral portion 311 and the crossing portions 312. The through holes 313 are spaced apart from each other and are arranged in arrays, such that the chips 32 are spaced apart from each other and are arranged in positions respectively corresponding to the through holes 313. Each of the chips 32 has a portion exposed through the corresponding one of the through holes 313. In this embodiment, said portion is a bottom portion of the chip 32, including solder balls as shown in FIG. 3.

The limiter 4 is made of the same kind of heat-resistant material as the surrounding frame part 21 in this embodiment, but may be made of a different kind of heat-resistant material in other embodiments. The limiter 4 includes two limiting parts 41. It should be noted that the number of the limiting parts 41 is not limited to the disclosure herein and may vary in other embodiments. Each of the limiting parts 41 interconnects two opposite points of the surrounding frame part 21 of the frame 2. The limiting parts 41 are positioned corresponding to the crossing portions 312 of the supporting film 31, respectively. The limiting parts 41 are positioned on the one side of the supporting film 31 where the chips 32 are to be adhered to.

It is worth to note that in this embodiment, the limiting parts 41 and the surrounding frame part 21 are integrally formed as one piece. However, implementation of connections between the limiting parts 41 and the surrounding frame part 21 is not limited to the disclosure herein and may vary in other embodiments, such as by welding.

In order to provide sufficient support for the chips 32 while maintaining a reasonable amount of space for arrangement of the chips 32 on the supporting film 31, in one embodiment, each of the limiting parts 41 of the limiter 4 and the crossing portions 312 of the supporting film 31 has a width ranging between 0.3 and 5 micrometers. In one embodiment, each of the limiting parts 41 and the crossing portions 312 has a width ranging between 0.3 and 3 micrometers, and the width of each of the limiting parts 41 is not greater than the width of each of the crossing portions 312.

In a scenario of using the chip carrier device according to the disclosure, the chips 32 are first adhered to one side (i.e., the adhesive) of the supporting film 31. The surrounding frame part 21 and the limiting parts 41 are then positioned on the one side of the supporting film 31. The limiting parts 41 are positioned corresponding to the crossing portions 312 of the supporting film 31, and the surrounding frame part 21 is adhered to the peripheral portion 311 of the supporting film 31. After that, the chip carrier device which carries the chips 32 is put on a platform 100 in the chamber (not shown) for sputter deposition.

In one embodiment, the supporting film 31 includes only one crossing portion 312 that passes through the center of the supporting film 31, and the limiter 4 includes only one limiting part 41 that is positioned corresponding to the crossing portion 312 of the supporting film 31, accordingly.

The limiting part (s) 41 of the limiter 4 placed over the supporting film 31 to correspond in position with the crossing portion 312 of the supporting film 31 holds the supporting film 31, which carries the chips 32, in place against cooling air 101 blown toward the supporting film 31. Specifically, each limiting part 41 of the limiter 4 abuts against the corresponding crossing portion 312 of the supporting film 31 to act as a strengthening structure for the supporting film 31, thereby increasing stability of the supporting film 31 on the platform 100 and alleviating the degree of deformation of the supporting film 31 under influence of the air cooling 101 during sputter deposition. In this way, thickness uniformity of thin films coated on the chips 32 may be maintained, and quality of sputter deposition may be improved.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A chip carrier device adapted to hold a plurality of chips in a chamber for sputter deposition, said chip carrier device comprising:
    a frame including a surrounding frame part;
    a chip support disposed on said frame, and including
        a supporting film that is adapted for the chips to be arranged on and adhered to one side of said supporting film and that includes
            a peripheral portion which corresponds in shape to said surrounding frame part and which is attached to said surrounding frame part, and
            at least one crossing portion which passes through a center of said supporting film and which interconnects two opposite points of said peripheral portion,
        said supporting film being formed with a plurality of through holes which are in groups with each of the groups being encircled by said peripheral portion and said at least one crossing portion, said through holes being each adapted for placement of a respective one of the chips such that a portion of the respective one of the chips is exposed therethrough, said through holes being spaced apart from each other and arranged in arrays, such that the chips are spaced apart from each other and arranged in positions respectively corresponding to said through holes; and
    a limiter including
        at least one limiting part that interconnects two opposite points of said surrounding frame part, that is positioned corresponding to said at least one crossing portion, and that is positioned on the one side of said supporting film where the chips are to be adhered to.

2. The chip carrier device as claimed in claim 1, wherein said at least one limiting part has a width ranging between 0.3 and 5 micrometers.

3. The chip carrier device as claimed in claim 1, wherein:
each of said at least one limiting part and said at least one crossing portion of said supporting film has a width ranging between 0.3 and 3 micrometers; and
the width of said at least one limiting part is not greater than the width of said at least one crossing portion of said supporting film.

4. The chip carrier device as claimed in claim 1, wherein said supporting film is a single-sided adhesive film.

5. The chip carrier device as claimed in claim 1, wherein said at least one limiting part and said surrounding frame part are integrally formed as one piece.

6. The chip carrier device as claimed in claim 1, wherein:
said supporting film includes two of said crossing portions that intersect each other; and
said limiter includes two of said limiting part that are positioned corresponding to said crossing portions of said supporting film, respectively.

\* \* \* \* \*